United States Patent
Svard et al.

(10) Patent No.: US 7,327,006 B2
(45) Date of Patent: Feb. 5, 2008

(54) SEMICONDUCTOR PACKAGE

(75) Inventors: Mikael Svard, Espoo (FI); Nigel Martin, Salo (FI)

(73) Assignee: Nokia Corporation, Espoo (FI)

( * ) Notice: Subject to any disclaimer, the term of this patent is extended or adjusted under 35 U.S.C. 154(b) by 48 days.

(21) Appl. No.: 11/166,493

(22) Filed: Jun. 23, 2005

(65) Prior Publication Data
US 2006/0290006 A1 Dec. 28, 2006

(51) Int. Cl.
*H01L 31/00* (2006.01)
*H01L 21/44* (2006.01)

(52) U.S. Cl. .................. 257/459; 257/678; 257/693; 438/106; 438/107; 438/109

(58) Field of Classification Search ........ 438/106–109; 257/678, 687, 693, 700, 459
See application file for complete search history.

(56) References Cited

U.S. PATENT DOCUMENTS

| | | | | |
|---|---|---|---|---|
| 6,618,578 B1 * | 9/2003 | Petite | .................. | 455/92 |
| 6,861,366 B1 | 3/2005 | Katz | .................. | 438/725 |
| 6,996,652 B1 * | 2/2006 | Ong | .................. | 710/305 |
| 2003/0202330 A1 * | 10/2003 | Lopata et al. | ............... | 361/760 |
| 2005/0211465 A1 * | 9/2005 | Sunohara et al. | ........... | 174/260 |
| 2005/0211749 A1 * | 9/2005 | Hu et al. | ............... | 228/180.22 |

FOREIGN PATENT DOCUMENTS

| WO | WO-2004/077903 A1 | 9/2004 |
|---|---|---|
| WO | WO-2005/027602 A1 | 6/2005 |

* cited by examiner

*Primary Examiner*—Hsien-Ming Lee
(74) *Attorney, Agent, or Firm*—Harrington & Smith, PC

(57) ABSTRACT

A semiconductor package includes a combination die embedded in a base. The combination die includes a plurality of functional blocks, where the functional blocks are insulated from one another on the combination die. Each functional block has plural die connectors. The base includes insulating layers conductive layers and vias. Each conductive layer has parts removed to form a pattern. The base is provided with a plurality of external connectors. A conductive path, made from a part of at least one of the conductive layers and at least one of the vias, connects one of the die connectors to a respective one of the external connectors.

17 Claims, 3 Drawing Sheets

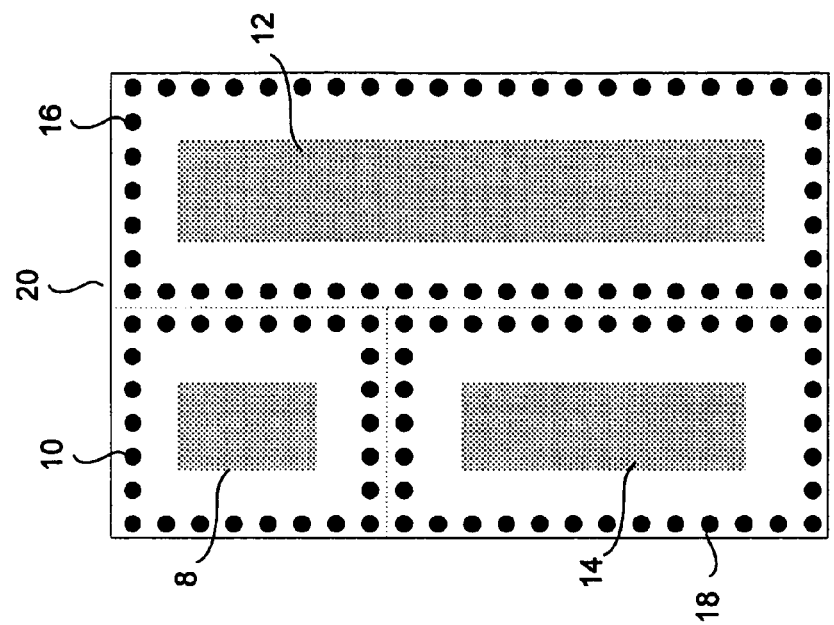
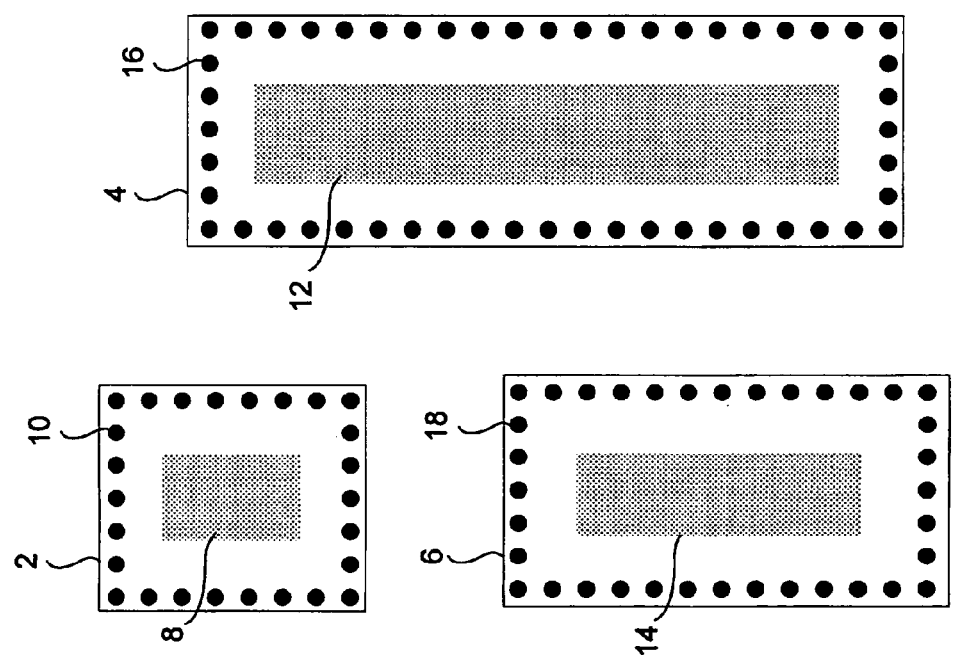
Figure 1B
Figure 1A
Prior Art

SEMICONDUCTOR PACKAGE

FIELD OF THE INVENTION

The present invention relates to a semiconductor package, and in particular to a semiconductor package comprising a die embedded within a base. The invention relates also to a method of making a semiconductor package.

BACKGROUND OF THE INVENTION

A bare die is usually packaged before it is suitable for connecting to a circuit board. A common technique for packaging die is wire bonding, in which a fine wire provides a connection between a contact site on a die and a contact site on a substrate. The substrate may be the ceramic base of a package, an organic laminate or another chip. When wire bonding is used, the connection sites must usually be near to the periphery of the die, and are usually limited to one or two rows of contacts. This places a limit on the minimum size of the die, which can become problematic when the number of contacts is large.

A recently developed technique for packaging die involves embedding the die, for example in an organic laminate. An advantage of using embedded die is that connections from the die are no longer limited to being near its periphery, so the size of the die can be decreased for a given number of contacts.

WO 2004/077903 describes an electronic module that includes a component, such as a die, embedded in a laminate. The die is surrounded by an insulator. Contact sites on the die are connected to a conductive layer pattern on one of the outer layers of the laminate by means of conductive pathways running through the insulator. Array-type connections can be made on the die.

When there are several dice, current techniques involve arranging bare dice side by side on a common substrate. The combined package is known as a multi-chip module (MCM). The bare dice can be bonded to a substrate using wire bonding or tape-automated bonding and interconnected. Alternatively, the dice can be embedded in a laminate and connected to one another using vias. An advantage of using MCMs is that signal delay due to the length of connections between the dice is minimised.

WO 2005/027602 describes an electronic module comprising three components, such as dice, embedded within a laminate. Conductive patterns within the laminate connect the required contacts on each die to contacts on the other dice.

Another technique for providing multiple dice in a package is three dimensional packaging technology. In these packages, the dice are stacked on one another. If the dice are to be wire-bonded, the dice are stacked in size order with the smallest on top. Again, peripheral connection sites are preferable. This provides a package with a much smaller footprint than a two dimensional package, and thus a much larger silicon efficiency than MCMs. Another advantage is that the length of the interconnections between the die can be much shorter than in MCMs. However, the total thickness of the die increases. In addition, the manufacturing process can be more complex than for MCMs.

U.S. Pat. No. 6,861,366 describes a packaged semiconductor device that includes two dice. The first die is attached to a substrate, and wire bonds connect the contacts on the first die to contacts on the substrate. An encapsulant extends over the first die and its wire bonds. The second die is stacked on top of the encapsulant, and also has wire bonds connecting its contacts with the contacts on the substrate. The second die and its wire bonds are also covered with an encapsulant.

SUMMARY OF THE INVENTION

According to a first aspect of the invention, there is a semiconductor package comprising: a base, the base having external connectors at one or more exterior surfaces thereof; and a combination die embedded within the base, the combination die comprising a plurality of functional blocks, the functional blocks being electrically insulated from one another on the die, each of said functional blocks having plural die connectors; wherein the base comprises a plurality of conductive paths each arranged to connect one of the die connectors to a respective one of the external connectors.

The above solution can provide a single die with an area substantially equal to the sum of the areas of the functional blocks. This can lead to fewer packages, and/or smaller packages. This can in turn result in significant area savings on a motherboard on which the die is mounted. It also can reduce the time required to carry out the embedding process, and the complexity of that process. Significantly, it allows the use of existing functional block designs without modification or redesign. This has benefits in increased package, design speed and reduced wastage.

According to a second aspect of the present invention, there is provided a method of making a semiconductor package, the method comprising: providing a base; providing the base with external connectors at one or more exterior surfaces thereof; providing a combination die with a plurality of functional blocks, the functional blocks being electrically insulated from one another on the die, providing each of said functional blocks with plural die connectors; embedding the combination die within the base; and providing the base with a plurality of conductive paths each connecting one of the die connectors to a respective one of the external connectors.

The result can be a semiconductor package having some or all of the advantages outlined above. The steps of the method can be carried out in any suitable order.

BRIEF DESCRIPTION OF THE DRAWINGS

Embodiments of the present invention will now be described, by way of example only, with reference to the accompanying drawings, in which:

FIG. 1A illustrates three known dice, each provided with a single functional block;

FIG. 1B illustrates a first embodied combination die, provided with the three

FIG. 1A functional blocks, useable in a semiconductor package according to the invention;

In the Figures, reference numerals are re-used for like elements throughout.

DETAILED DESCRIPTION OF THE INVENTION

Figure 2B:
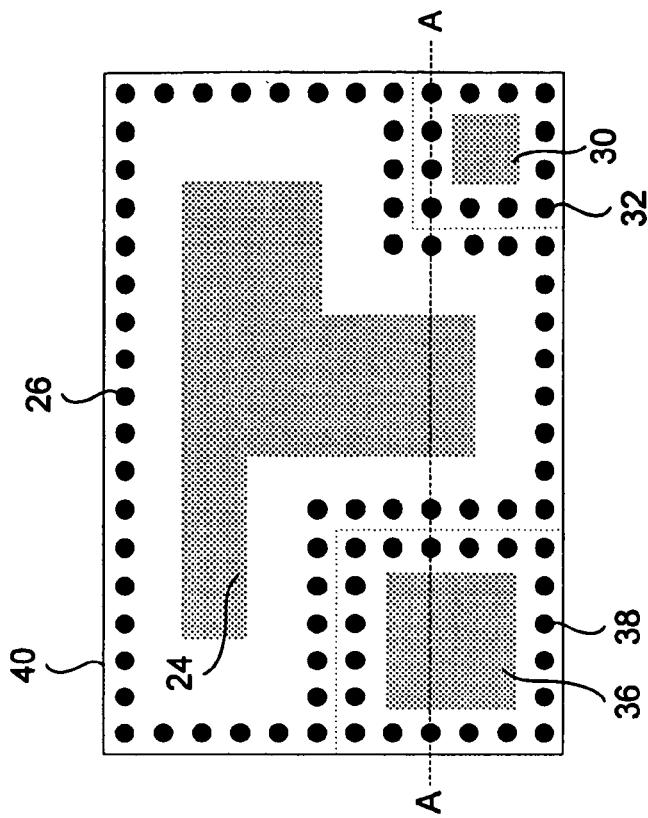
FIG. 2B illustrates a second combination die, provided with the three FIG. 2A functional blocks, usable in a semiconductor package according to the invention.

Referring firstly to FIG. 1A, first, second, and third dice 2, 4, 6, are shown.

The first die 2 is provided with a first functional block 8. The first functional block 8 is provided in the centre of the first die 2. A plurality of die connectors 10 are provided around the periphery of the first die 2. Thus, the die is suitable for being wire-bonded to a substrate, or packaged in any other suitable way. The structure of the first die 2 is as found in the prior art.

The second die 4 and the third die 6 have the same general structure as the first die 2, although their dimensions are different. That is, the second die 4 and the third die 6 are also provided with second 12 and third 14 functional blocks respectively, both functional blocks being provided in the middle of their respective die. The second die 4 and the third die 6 are also each provided with a plurality of die connectors 16, 18 provided on the periphery of their respective die 12, 14.

The first to third dice 2, 4, 6 are cut from a semiconductor wafer. The functional blocks 8, 12, 14 comprise interconnected electronic elements such as transistors, resistors and capacitors, that are etched onto the die. The die connectors 10, 16, 18 are formed of a conductive material, such as metal.

The three functional blocks 8, 12, 14 may comprise unrelated functions for operating a single device. For example, the three functions 8, 12, 14 may comprise a Bluetooth™ functional block, a cellular radio functional block and a GPS (Gobal Positioning System) receiver functional block of a mobile terminal respectively.

FIG. 1B illustrates a first combination die 20, usable in a semiconductor package according to the invention. The first 8, second 12 and third 14 functional blocks are provided on the combination die 20. The arrangement of the first functional block 8 and the die connectors 10 is identical to the arrangement of the first die 2. Similarly, the second functional block 12 and the die connectors 16 have identical arrangements to that of the second die 6, and the third functional block 14 and the die connectors 18 have an identical arrangement to that of the third die 6. On the combination die 20, the die connectors 10, 16 and 18 are not all near the periphery of the combination die 20. Thus the combination die 20 is not suitable for conventional packaging methods such as wire-bonding.

The combination die 20 is manufactured using the same processes as the conventional, single-function dice 2, 4, 6.

In the first embodiment, the first, second and third dice 2, 4, 6 have dimensions such that, when they are placed on the combination die 20 with no rearrangement of the die connectors 10, 16, 18, the total area of the combination die 20 is equal to the sum of the areas of the first, second and third dice 2, 4, 6.

In a second embodiment, which will now be described with reference to FIGS. 2A and 2B, the dimensions of a combination die, comprising functional blocks and connectors in the same relative positions to one another as on their single-function dice, may be slightly less than the sum of the areas of the individual die.

Figure 2A:
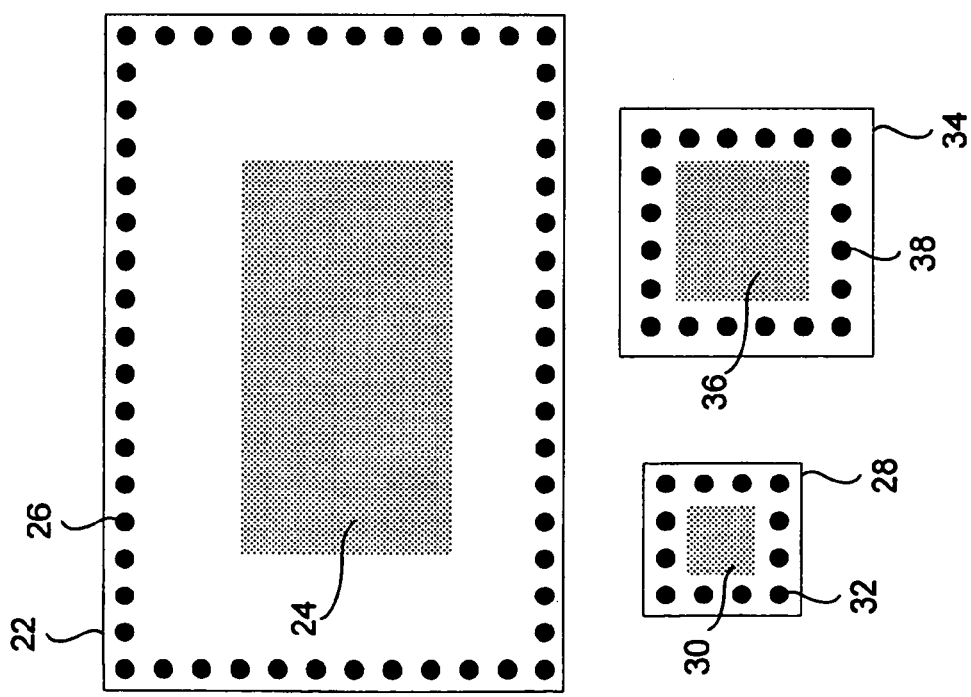
FIG. 2A illustrates three further known dice, each provided with a single functional block.

FIG. 2A shows three single-function dice 22, 28, 34. These single-function die have the same general structure as the first, second and third die 2, 4, 6, of FIG. 1A, although they have different dimensions and different functionality. Each die 22, 28, 34 is provided with a functional block in its centre 24, 30, 36 and die connectors around its periphery 26, 32, 38.

As is evident from the dimensions of the single-function dice 22, 28, 34, if a rectangular combination die is created using the functional blocks 24, 30, 36 and die connectors 26, 32, 38 in the same positions relative to one another as on the single-function dice, the area of the combination die will be greater than the sum of the areas of the single-function dice 22, 28, 34. This occurs because there is unused space on such a combination die.

FIG. 2B shows a second combination die 40 used in a second embodiment of the invention. The combination die 40 is provided with the functional blocks 24, 30, 36 of the single-function dice 22, 28, 34 of FIG. 2A. In order to minimise the area of the combination die 40, the connectors 26 of the largest single-function die 22 are re-arranged on the combination die 40. The connectors 32, 38 of the two smallest single-function dice 28, 34 retain the same arrangement relative to their respective functional blocks 30, 36 on the combination die 40. The arrangement of connectors on the combination die 40 ensures that there is the minimum possible amount of unused space. Thus the area of the combination die 40 is substantially the same as the sum of the areas of the three single-function dice 22, 28, 34.

The shape of the first functional block 24 is different on the combination die 40 than on the first die 22. The functional block 24 is designed to have a shape which allows the connectors 26 associated with it to be formed around the connectors 32, 38 of the other functional blocks 30, 36 to form a generally rectangular combination die 40. The surface area of the combination die 40 is the same as the sum of the areas of the dice 22, 28, 34. In another embodiment (not shown), the functional block 24 is not redesigned, and has the same shape on the combination die 40 as on the first die 22. This may provide a small amount of unused area within a rectangular combination die, but requires less redesign.

The die connectors 26, 32, 38 on the combination die 40 are not all near the periphery of the die. Thus, the die is not suitable for being wire-bonded to a substrate.

In both embodiments, the combination die 20, 40 is embedded within a respective laminate.

Figure 3:
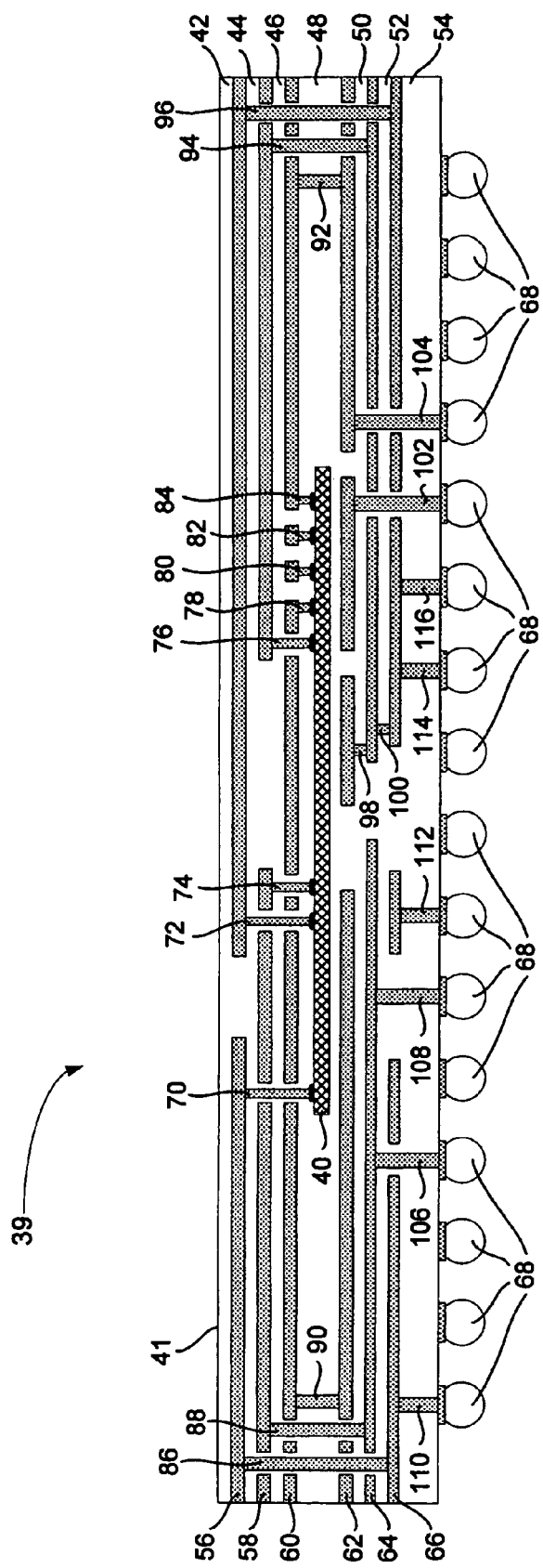
FIG. 3 illustrates a cross-sectional view of a semiconductor package according to the invention, including the FIG. 2B combination die embedded in a base.

FIG. 3 shows a semiconductor package 39 according to the invention. The semiconductor package comprises the second combination die 40 embedded in a base 41. The Figure shows a cross section taken along the line A-A of the second combination die 40 in FIG. 2B. The first combination die 20 is embedded in a base (not shown) in a similar way. The base 41 is comprised of a laminate. The laminate is comprised of first to seventh insulating layers 42, 44, 46, 48, 50, 52, 54, separated from each other by first to sixth conductive layers 56, 58, 60, 62, 64, 66. The conductive layers 56, 58, 60, 62, 64, 66 each form a pattern. The gaps in the pattern of each conductive layer 56, 58, 60, 62, 64, 66 is filled with an insulating material. The combination die 40 is embedded within the fourth insulating layer 48. The base 41 is provided with external connectors 68. These external connectors 68 are provided by a ball grid array. In other embodiments, the externals connectors can be provided by a land grid array, or by any other suitable means.

Numerous vias are provided in the base 41. The vias provide vertical connections through the layers of the base 41. Some of the vias are used to connect the die connectors 26, 32, 38 to certain ones of the top three conductive layers 56, 58, 60. These vias can extend to any required point on the combination die 40. In the plane shown, first and second vias 70 and 72 connect the die connectors 38 of the third (leftmost) functional block 36 to parts of the first conductive layer 56. Third and fourth vias 74 and 76 connect the die connectors 26 of the first functional block 24 to parts of the second conductive layer 58. Fifth to eighth vias 78, 80, 82, 84 connect the die connectors 32 of the second (rightmost) functional block 30 to parts of the third conductive layer 60.

Vias also connect conductive layers on opposing sides of the combination die 40 to one another. Ninth and tenth vias 86 and 90 connect parts of the first conductive layer 56 to parts of the sixth conductive layer 66 on the left and right side of the base 41 respectively. Eleventh and twelfth vias 88 and 94 connect parts of the second conductive layer 58 to parts of the fifth conductive layer 64 on the left and right side of the base 41 respectively. Thirteenth and fourteenth vias 90 and 92 connect parts of the third conductive layer 60 to parts of the fourth conductive layer 62 on the left and right side of the base 41 respectively.

Vias also connect conductive layers on the same side of the combination die 40 to one another. A fifteenth via 98 connects parts of the fourth conductive layer 62 to parts of the fifth conductive layer 64. A sixteenth via 100 connects parts of the fifth conductive layer 64 to parts of the sixth conductive layer 66.

Finally, vias are used to connect the external connectors 68 to the conductive layers. Seventeenth and eighteenth vias 102 and 104 each connect parts of the fourth conductive layer to an external connector. Nineteenth and twentieth vias 106 and 108 each connect parts of the fifth conductive layer to an external connector. Further vias 108, 110, 112 and 114 each connect parts of the sixth conductive layer to a respective external connector.

Thus, a connection is made between a die connector and an external connector by means of: a via connecting the die connector to either the first, second or third conductive layer; the first, second or third conductive layer; a via connecting the first, second or third conductive layer to the fourth, fifth or sixth conductive layer; the fourth, fifth or sixth conductive layer; and a via connecting the fourth, fifth or sixth conductive layer to an external connector. In this way, connections can be made from any point on the combination die 40 to any of the external connectors 68, provided that the design limitations of the manufacturing process are met.

The semiconductor package 39 can be fabricated layer-by-layer according to the following steps. Firstly, an insulating block is provided as the insulating layer 48. The insulating block 48 is thicker than the combination die 40. A complete layer of a conducting material is then applied to one side of the insulating layer 48, and forms the third conductive layer 60. A cavity is formed in the insulating block 48, in the side opposite to the third conductive layer 62. The cavity is the same size or slightly larger than the combination die 40. The combination die 40 is placed in the cavity, and an insulating filler, such as a polymer, is used to completely fill the cavity. Parts of the conductive material forming the third conductive layer are then removed to form a pattern. The removal of conductive material can be performed using vaporisation with a laser. A further layer of conductive material is then applied to the other side of the insulating block 48, and provides the fourth conductive layer 60. Again, parts of the conductive material are removed to form a pattern. The vias are provided by laser drilling holes through the laminate, and growing a conductive material, such as copper, in the holes.

Further conductive layers are applied to each side of the laminate. Successive conductive layers are separated by a respective insulating layer. These conductive layers and insulating layers can be applied by pressing a RCF foil onto each conductive layer pattern, where the RCF foil includes an insulating material layer and a conductive material layer. As many vias and conductive layers as are required can be added using the processes described above.

One suitable technique for the manufacture of a semiconductor package comprising a die embedded in a laminate is discussed in detail in WO 2005/027602. However, the invention is not limited to this method of building the semiconductor package, and any suitable method may be used. For example, another suitable technique for embedding a combination die 20, 40 in a base involves placing the combination die 20, 40 directly on a conductive layer, where it is glued in place. Sheets of insulator are then placed around the die. When this technique is used, no epoxy filler need surround the die. Further sheets of conductive material, such as copper, are applied by heating and pressing to surround the die. The techniques needed to produce a semiconductor package comprising a die embedded in a laminate are now generally known in the art.

Once the laminate is complete, the ball grid array 68 is provided by sticking balls of solder to the final conductive layer. The semiconductor package 39 can then be attached to a motherboard (not shown). The motherboard is provided with a set of copper pads that matches the pattern of the ball grid array. The semiconductor package and motherboard are then heated to cause the solder balls to melt slightly.

In this embodiment, functions on the combination die are insulated from each other, and then connected using conductive paths on the motherboard. In other embodiments (not shown), connections between the functions are made using conductive tracks in the base.

In the above embodiment, the active surface faces away from the external connectors 68. The active surface is the surface on which the functional blocks and the die connectors are provided, of the combination die 40. In another embodiment (not shown) the combination die 40 may be embedded in the base 41 such that its active surface faces the external connectors 68.

In another embodiment (not shown), a semiconductor package comprises two combination dice embedded in a base. The two combination dice are provided in different layers of the base, to provide a stacked arrangement. Connections between the two combination dice are provided either by conductive layers and vias within the base, or by conductive paths between the external connectors on a motherboard on which the semiconductor package is mounted.

A combination die 40 can be constructed with functional blocks which together constitute an entire mobile phone engine. Thus, one package alone can provide the functionality of a mobile phone engine. Also, a combination die 40 can be constructed with functional blocks which together constitute a cellular modem. Thus, one package alone can provide the functionality of a cellular modem.

Although the present invention has been described with respect to the above embodiments, it should be apparent to those skilled in the art that modifications can be made without departing from the scope of the invention.

For example, any suitable pattern of conductive paths within the base can be used to connect a die connector to a respective one of the external connectors. It is not necessary that all of the die connectors 26, 32, 38 relating to a particular functional block 24, 30, 36 are connected to the same one of the first, second and third conductive layers 56, 58, 60. Any suitable arrangement can be used. Also, the mapping between the die connectors and the external connectors may not be one to one.

Also, the combination die 40 may not be surrounded on all sides by the fourth insulating layer 48. For instance, its uppermost surface may be overlaid directly with the third conductive layer 60. In this case, the third conductive layer 60 is patterned with tracks that connect to some of the die connectors 26, 32, 38 which are at the periphery of the combination die 40. The others of the die connectors 26, 32, 38 are connected by way of vias to one of the first and second conductive layers 56, 58. The combination die 40 nonetheless is an embedded die.

The invention claimed is:

1. A semiconductor package comprising:
a base, the base having external connectors at one or more exterior surfaces thereof; and
a combination die embedded within the base, the combination die comprising a plurality of functional blocks, the functional blocks being electrically insulated from one another on the die, each of said functional blocks having plural die connectors;
wherein the base comprises a plurality of conductive paths each arranged to connect one of the die connectors to a respective one of the external connectors.

2. A semiconductor package as claimed in claim 1, wherein the base is arranged to insulate electrically all of the die connectors of a given functional block from the die connectors of every other functional block.

3. A semiconductor package as claimed in claim 2, wherein the semiconductor package is mounted on a motherboard, and wherein one or more connections between the functional blocks are provided on the motherboard.

4. A semiconductor package as claimed in claim 1, wherein the external connectors are provided by a ball grid array.

5. A semiconductor package as claimed in claim 1, wherein the external connectors are provided by a land grid array.

6. A mobile phone engine comprising a semiconductor package,
the semiconductor package comprising:
a base, the base having external connectors at one or more exterior surfaces thereof; and
a combination die embedded within the base, the combination die comprising a plurality of functional blocks, the functional blocks being electrically insulated from one another on the die, each of said functional blocks having plural die connectors;
wherein the base comprises a plurality of conductive paths each arranged to connect one of the die connectors to a respective one of the external connectors.

7. A cellular modem comprising a semiconductor package,
the semiconductor package comprising:
a base, the base having external connectors at one or more exterior surfaces thereof; and
a combination die embedded within the base, the combination die comprising a plurality of functional blocks, the functional blocks being electrically insulated from one another on the die, each of said functional blocks having plural die connectors;
wherein the base comprises a plurality of conductive paths each arranged to connect one of the die connectors to a respective one of the external connectors.

8. A method of making a semiconductor package, the method comprising:
providing a base;
providing the base with external connectors at one or more exterior surfaces thereof;
providing a combination die with a plurality of functional blocks, the functional blocks being electrically insulated from one another on the die,
providing each of said functional blocks with plural die connectors;
embedding the combination die within the base; and
providing the base with a plurality of conductive paths each connecting one of the die connectors to a respective one of the external connectors.

9. A semiconductor package as in claim 1, wherein the base comprises a cavity to allow the embedding of a combination die within the base.

10. A semiconductor package as in claim 1, wherein the functional blocks are disposed in the combination die in a side-by-side relationship with respect to each other.

11. A mobile phone engine as in claim 6, wherein the base comprises a cavity to allow the embedding of a combination die within the base.

12. A mobile phone engine as in claim 6, wherein the functional blocks are disposed in the combination die in a side-by-side relationship with respect to each other.

13. A cellular modem as in claim 7, wherein the base comprises a cavity to allow the embedding of a combination die within the base.

14. A cellular modem block as in claim 7, wherein the functional blocks are disposed in the combination die in a side-by-side relationship with respect to each other.

15. A method of making a semiconductor package as in claim 8, wherein the functional blocks are disposed in the combination die in a side-by-side relationship with respect to each other.

16. A method of making a semiconductor package as in claim 8, the method further comprising adding conductive layers over the combination die when embedded within the base.

17. A method of making a semiconductor package as in claim 16, wherein the added conductive layers are separated from each other by insulating layers.

* * * * *